United States Patent
Ludwig et al.

(10) Patent No.: US 9,546,827 B2
(45) Date of Patent: Jan. 17, 2017

(54) DEVICE FOR CONDUCTING A COOLING FLUID, AND COOLING SYSTEM FOR COOLING AN ELECTRICAL COMPONENT

(75) Inventors: Lars Ludwig, Altbach (DE); Michael Moser, Rainau (DE); Matthias Stripf, Karlsruhe (DE); Hans-Georg Herrmann, Stuttgart (DE)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 316 days.

(21) Appl. No.: 13/990,225

(22) PCT Filed: Oct. 26, 2011

(86) PCT No.: PCT/EP2011/068799
§ 371 (c)(1),
(2), (4) Date: May 29, 2013

(87) PCT Pub. No.: WO2012/072348
PCT Pub. Date: Jun. 7, 2012

(65) Prior Publication Data
US 2013/0250512 A1    Sep. 26, 2013

(30) Foreign Application Priority Data

Nov. 30, 2010  (DE) .................. 10 2010 062 218
Jun. 6, 2011  (DE) .................. 10 2011 104 713

(51) Int. Cl.
*F28F 1/00*   (2006.01)
*H05K 7/20*   (2006.01)
(Continued)

(52) U.S. Cl.
CPC ............ *F28F 1/00* (2013.01); *H01M 10/6556* (2015.04); *H05K 7/20* (2013.01); *H01M 10/613* (2015.04);
(Continued)

(58) Field of Classification Search
CPC .......... H05K 7/20254; H05K 7/20; F28F 1/00; H01M 10/6556; H01M 10/6565; H01M 10/6567; H01M 10/613; H01M 10/615
(Continued)

(56) References Cited

U.S. PATENT DOCUMENTS 3,616,533 A * 11/1971 Heap et al. .................. 29/837
4,072,188 A *  2/1978 Wilson et al. ............. 165/80.4
(Continued)

FOREIGN PATENT DOCUMENTS

DE           28 00 080 A1    7/1978
DE    10 2008 059 952 A1    6/2010
(Continued)

OTHER PUBLICATIONS

International Search Report, PCT/EP2011/068799, Jan. 3, 2012, 3 pgs.

*Primary Examiner* — Adam B Dravininkas
(74) *Attorney, Agent, or Firm* — Paul D. Strain, Esq.; Strain & Strain PLLC

(57) ABSTRACT

The invention relates to a device for conducting a cooling fluid for cooling an electrical component. The device comprises a fluid conducting chamber for conducting the cooling fluid, and an at least partially flexible cover, which seals the fluid conducting chamber in a fluid-tight manner and which forms a heat transmission zone for conducting heat between the cooling fluid and the electrical component.

12 Claims, 3 Drawing Sheets

(51) Int. Cl.
*H01M 10/6556* (2014.01)
*H01M 10/615* (2014.01)
*H01M 10/6567* (2014.01)
*H01M 10/6565* (2014.01)
*H01M 10/613* (2014.01)

(52) U.S. Cl.
CPC ....... *H01M 10/615* (2015.04); *H01M 10/6565* (2015.04); *H01M 10/6567* (2015.04)

(58) Field of Classification Search
USPC .............................. 361/699, 702; 165/104.33
See application file for complete search history.

(56) References Cited

U.S. PATENT DOCUMENTS

| | | | | |
|---|---|---|---|---|
| 4,155,402 | A | * | 5/1979 | Just ................................. 165/46 |
| 4,315,499 | A | * | 2/1982 | Shonerd ........................ 126/591 |
| 4,854,377 | A | * | 8/1989 | Komoto et al. ............. 165/80.4 |
| 4,997,032 | A | * | 3/1991 | Danielson et al. ............. 165/46 |
| 5,205,348 | A | * | 4/1993 | Tousignant et al. ........... 165/46 |
| 5,323,292 | A | * | 6/1994 | Brzezinski .................... 361/689 |
| 6,061,243 | A | * | 5/2000 | Barnett et al. ................ 361/704 |
| 7,007,741 | B2 | * | 3/2006 | Sen et al. ........................ 165/46 |
| 2007/0159799 | A1 | * | 7/2007 | Dando, III ............ H01L 23/373 361/709 |
| 2007/0215332 | A1 | * | 9/2007 | Eisele ...................... F28F 3/12 165/169 |
| 2007/0285051 | A1 | | 12/2007 | Jeon et al. |
| 2009/0186265 | A1 | | 7/2009 | Koetting et al. |
| 2009/0208828 | A1 | | 8/2009 | Kanai et al. |

FOREIGN PATENT DOCUMENTS

| | | |
|---|---|---|
| EP | 0 516 280 A1 | 12/1992 |
| EP | 2 051 314 A1 | 4/2009 |
| WO | WO 2008/098555 A1 | 8/2008 |

* cited by examiner

DEVICE FOR CONDUCTING A COOLING FLUID, AND COOLING SYSTEM FOR COOLING AN ELECTRICAL COMPONENT

CROSS-REFERENCE TO RELATED PATENT APPLICATIONS

This application is a National Stage of International Application No. PCT/EP2011/068799, filed Oct. 26, 2011, which is based upon and claims the benefit of priority from prior German Patent Applications No. 10 2010 062 218.4, filed Nov. 30, 2010 and No. 10 2011 104 713.5, filed Jun. 6, 2011, the entire contents of all of which are incorporated herein by reference in their entirety.

The present invention relates to a device for conducting a cooling fluid for cooling an electrical component, and to a cooling system for cooling an electrical component.

Complex radiators which require complicated production methods are currently used in the automobile industry for cooling electrical components. Furthermore, cost-intensive heat-conducting materials for compensating for surface unevennesses on the components which are to be cooled are also required. Electrical insulation of the radiator has to be ensured by means of additional measures.

DE 10 2008 059 952 A1 discloses a battery having a plurality of battery cells and a cooling device for controlling the temperature of the battery cells. The cooling device comprises a heat exchanger which makes contact with the battery cells at contact points for the purpose of heat exchange and is designed to be electrically insulating at least at the contact points to the battery cells.

The object of the present invention is to provide an improved device for conducting a cooling fluid and an improved cooling system for cooling an electrical component.

This object is achieved by a device and a cooling system according to the independent claims.

The present invention is based on the knowledge that a cost-effective method for producing a radiator while at the same time providing electrical insulation can be provided by establishing a flexible thermal connection between a radiator and a component which is to be cooled, without using additional heat-conducting material.

The degree of efficiency of the radiator can be increased by flexibly adapting the contact area of the radiator to an existing component surface. On account of the use of heat-conducting materials as a flexible thermal connection, it is advantageously possible to dispense with an additional cost-intensive thermal connection between components which are to be cooled and the radiator surface. This allows cost-effective production of the individual radiator parts, of the radiator and of the electrical insulation means. In addition to the use of more favorable production methods, a weight advantage on account of the use of less material and a reduction in the passive, thermal mass result in a further cost reduction.

The present invention provides a device for conducting a cooling fluid for cooling an electrical component, wherein the device has the following features:

a fluid-conducting chamber for conducting the cooling fluid; and an at least partially flexible cover which closes off the fluid-conducting chamber in a fluid-tight manner and forms a heat-transfer region for conducting heat between the cooling fluid and the electrical component.

The device can be a heat exchanger or radiator. The electrical component may be a battery. Therefore, the device can be used, for example, to cool a rechargeable battery in an electric vehicle. The fluid may be a liquid or gaseous coolant. The fluid-conducting chamber can have, for example, the shape of a rectangular flat tub with two openings, so that the cooling fluid can enter the fluid-conducting chamber through one of the openings, can flow through an interior space in the fluid-conducting chamber, and then exit the fluid-conducting chamber again through the other of the openings. The fluid-conducting chamber can also have geometric shapes other than a rectangular shape. The cover can be of flat design and have a contour which corresponds to a contour of the fluid-conducting chamber, so that the cover can be placed, for example, with an accurate fit on side walls of the fluid-conducting chamber and can be connected to said side walls in a fluid-tight manner. When the fluid-conducting chamber is conducting the cooling fluid, an inner face of the cover can be in direct contact with the cooling fluid. An outer face of the cover can serve as a support area for the electrical components which are to be cooled. In this case, the electrical component can be arranged in the heat-transfer region. The heat-transfer region can extend over an entire surface or a subregion of a surface of the cover. The cover can be formed from plastic or metal. The cover can be flexible or elastic at least in a subregion which can correspond to the heat-transfer region. A curvature can be formed in the cover by pressure being applied to the inner face. If the material which forms the cover is elastic, the cover side can bend and expand.

According to one embodiment, the cover can be deformed in the direction of the electrical component by a pressure of the fluid in the fluid-conducting chamber. For example, the cover can form one or more curvatures in a region which is not connected to the fluid-conducting chamber, as a result of which the surface of the cover can be matched to a base area of the electrical component and can advantageously increase the size of a heat-transfer area between the cover and the component. The degree of efficiency of cooling can be improved as a result. In addition, the deformation can be provided in a simple manner by the operation of the device, by the cooling fluid being introduced into the fluid-conducting chamber.

The cover can be a film or foil. A film or foil has a very low weight. In addition, on account of the low material thickness, the film or foil can be matched very effectively to a contour of the component which is to be cooled when said film or foil is subjected to the action of the coolant. The cooling performance can be improved as a result.

Furthermore, the cover can be formed from an electrically insulating material. Consequently, a separate component for providing insulation is not required. The device can therefore be produced more quickly, in a simpler manner and with a low weight.

According to a further embodiment, the cover can be flexible in a region which corresponds to a geometry of the electrical component and can be rigid in a remaining region. For example, the cover can be flexible in a central region in an extent of a base area of the component which is to be cooled, and can be inflexible in a boundary region which surrounds the central region and is not covered by the component. Therefore, the degree of robustness of the device can advantageously be improved, as a result of which it is more resistant to damage. In this case, flexible means that the fluid can cause deformation.

According to a further embodiment, a side of the cover which faces the electrical component can be structured. Therefore, a surface area of the heat-transfer region of the cover can be advantageously increased in size and the cooling performance can be correspondingly improved. In addition, the electronic components can be securely positioned on the cover of the device on account of the greater coefficients of friction which are provided by the structuring.

A side of the cover which faces the electrical component can also have an adhesive coating. This provides the advantage that the electrical component which is to be cooled can be connected to the device in a simple manner and without additional elements.

According to one embodiment, the fluid-conducting chamber is connected to the cover in an interlocking manner and/or in a force-fitting manner and/or in a materially cohesive manner. For example, the cover can have a plurality of spaced-apart passage openings in a edge region, and side walls of the fluid-conducting chamber can have holes with internal threads in corresponding positions, so that the cover and the fluid-conducting chamber can be connected to one another in an interlocking manner and/or in a force-fitting manner by means of suitable screws. As an alternative or in addition, the cover and the fluid-conducting chamber can be connected in a materially cohesive manner by means of a chemical or thermal joining process between the material regions which are in contact. In particular, a combination of interlocking/force-fitting and materially cohesive connection can ensure simultaneous robustness and fluid-tightness of the device.

Furthermore, the fluid-conducting chamber can have an interior space having at least one partition wall for conducting the cooling fluid. The interior space can be subdivided into individual regions, through each of which the cooling fluid can flow, by the partition wall. The partition wall can extend, for example, in a plurality of turns in the interior space in the fluid-conducting chamber in order to form an optimum flow path for the cooling fluid. For example, the partition wall can be arranged in the interior space such that it conducts the cooling fluid away from an inlet opening into the fluid-conducting chamber, and through the interior space in a meandering manner, and finally to an outlet opening out of the fluid-conducting chamber, without cooling fluid being able to flow back to the inlet opening. A plurality of individual walls can also be arranged in the fluid-conducting chamber, and form a suitable system for conducting fluid. The partition wall can be formed from the same material as the fluid-conducting chamber or from a different suitable material.

According to a further embodiment of the present invention, the fluid-conducting chamber can also be at least partially flexible. In this embodiment, the cover is preferably formed from plastic, in addition to the fluid-conducting chamber. The cover can be partially joined, preferably welded, to the fluid-conducting chamber.

According to a further embodiment, the film or foil can be heated.

According to a further embodiment, the film or foil is provided with particles or has a wire mesh for improving the heat conductivity.

According to a further embodiment, the lower face of the fluid-conducting chamber is likewise in the form of a film or foil according to the invention. Therefore, the fluid-conducting chamber forms an insert part which is closed in a fluid-tight manner by a film or foil at the upper and lower face. Therefore, cooling on both sides is possible on account of this embodiment.

The present invention also provides a cooling system for cooling an electrical component, which cooling system has the following features:
the electrical component; and
a device according to the invention for conducting a cooling fluid, wherein the electrical component is arranged in the heat-transfer region of the cover of the device. In this way, the electrical component can be cooled by means of the heat-transfer region, which is formed by the cover, when the fluid-conducting chamber is conducting a cooling fluid.

The cooling system can be used, for example, in an electric vehicle. The electrical component may be, for example, a rechargeable battery for operating the electric vehicle. The electrical component can be arranged on the cover of the device, for example by way of a base area. If a cooling fluid flows through the device, the cover can bend in the direction of the electrical component on account of its material-related flexibility or elasticity. The cover can therefore be matched to contours of a base region of the electrical component in an optimum manner and provide the largest possible heat-transfer region together with electrical insulation at the same time.

BRIEF DESCRIPTION OF THE DRAWINGS

Advantageous exemplary embodiments of the present invention will be explained in greater detail below with reference to the appended drawings, in which.

In the following description of the preferred exemplary embodiments of the present invention, the same or similar reference symbols are used for the elements which are illustrated in the various drawings and have a similar effect, said elements not being repeatedly described.

Said figures show a cost-effective radiator which cools electrical components by means of a suitable fluid. In this case, the radiator provides a flexible contact surface which matches a geometry of the component which is to be cooled.

Figure 1:
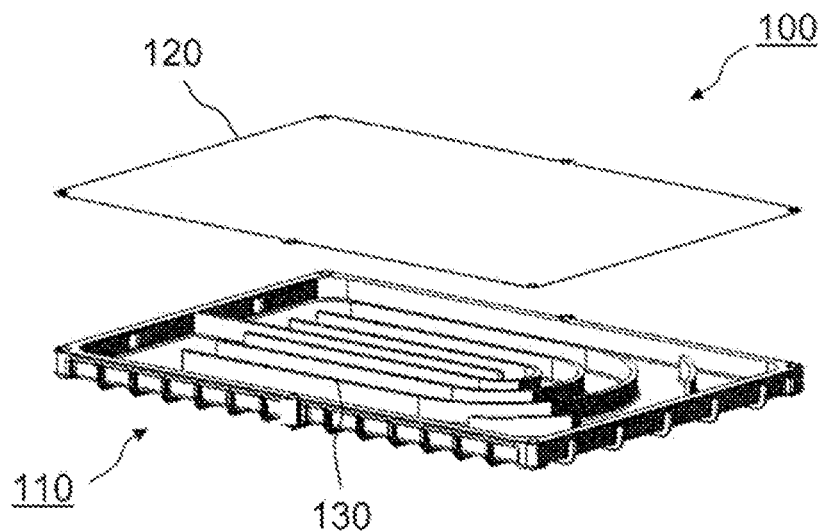
FIG. 1 shows a perspective illustration of a device for conducting a cooling fluid, according to one exemplary embodiment of the present invention.

FIG. 1 shows a perspective exploded illustration of an exemplary embodiment of a device 100 for conducting a cooling fluid. A fluid-conducting chamber 110 and a cover 120 are shown.

The fluid-conducting chamber 110 is in the form of a rectangular flat tub. An inlet opening and an outlet opening for the cooling fluid which are spaced apart from one another are arranged in a side wall of the fluid-conducting chamber 110, it being possible, for example, for a cooling fluid supply line and a cooling fluid discharge line to be connected to said inlet opening and, respectively, outlet opening in order to form a coolant circuit. A base inner surface of the fluid-conducting chamber 110 has a plurality of walls 130, the height of said walls corresponding to a height of the side walls of the fluid-conducting chamber 110. For the sake of clarity, only one of the walls 130 is provided with a reference symbol. Apart from one, the walls 130 have a U-shape. Therefore, coolant can be conducted from the inlet opening, through the entire interior of the fluid-conducting chamber, to the outlet opening in parallel flows and, in the process, perform heat exchange with an electrical component, which is arranged on the cover, via the cover 120. A straight wall which is connected to the side wall between the inlet opening and the outlet opening prevents cooling fluid from being able to flow from the inlet opening directly to the outlet opening. In the exemplary embodiment shown in FIG. 1, long side walls of the fluid-conducting chamber 110 have opposing holes, which are spaced apart from one another, for connecting the fluid-conducting chamber 110 to the cover 120. According to the illustration in FIG. 1, the fluid-conducting chamber 110 has a plurality of reinforcing ribs which extend over a base outer region as far as an upper edge of the side walls of the fluid-conducting chamber 110.

According to the illustration in FIG. 1, the cover 120 is flat and has a rectangular shape which corresponds to the fluid-conducting chamber 110. Long side walls of the cover 120 have opposing passage openings which are spaced apart and correspond to the holes in the fluid-conducting chamber 110, so that the cover 120 can be connected to the fluid-conducting chamber 110, for example, by means of screws.

Figure 2:
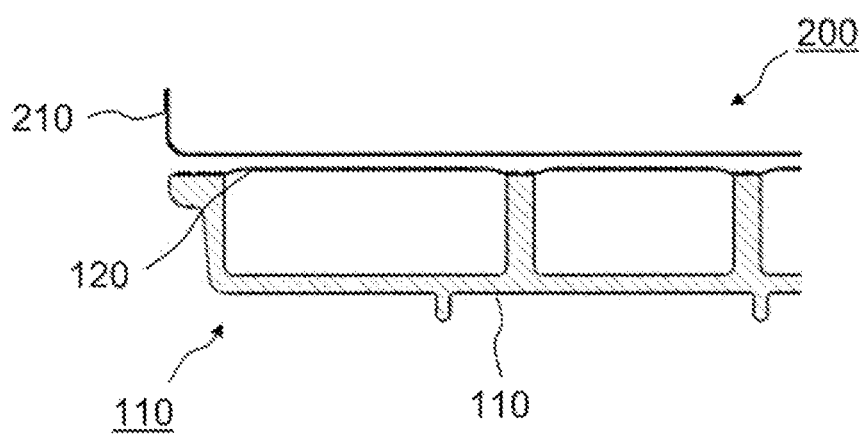
FIG. 2 shows a sectional illustration through a cooling system for cooling an electrical component, according to one exemplary embodiment of the present invention.

FIG. 2 shows a sectional illustration through a detail of a cooling system 200 for cooling an electrical component, according to one exemplary embodiment of the present invention. Said figure shows the device 100 from FIG. 1 in the assembled state and a base region of an electrical component 210. The illustration in FIG. 2 clearly shows that the cover 120 of the device 100 is curved in the direction of a base surface of the electrical component 210 which is to be cooled, between regions in which the cover 120 is connected to the fluid-conducting chamber 110, on account of a cooling-fluid pressure which prevails within the device 100.

One exemplary embodiment of a device 100, in this embodiment a film/foil radiator for electrical components, will be described below with reference to FIGS. 1 and 2. The radiator comprises at least one fluid conducting chamber 110, in this embodiment comprising a shaped part, which conducts the cooling medium, and at least one cover 120, in this embodiment comprising a film, which is composed of plastic or at least one foil which is composed of metal. The film or foil forms the contact area to the component which is to be cooled, and is connected to the shaped part in an interlocking manner, in a force-fitting manner or in a materially cohesive manner or by means of a chemical or thermal joining process. The surface of the film or foil can be designed to be both structured and also smooth. An additional adhesive coating is optional. When subjected to the action of a cooling fluid, the film or foil rests flexibly against the surface of the component 210 which is to be cooled. The flexible region of the film or foil can optionally be matched to a geometry of the component 210 which is to be cooled. In addition, a degree of connection can be influenced by means of the joining force between the component which is to be cooled and the film or foil. In general, different types of throughflow are possible, for example flow in an I-shape, in a U-shape, in an S-shape or in a W shape or flow with several deflection points. Various types of connection to the radiator are possible, for example hose-type connection pieces, screw-in connection pieces or quick-action coupling connections. A composite panel allows a plurality of fluid connections (1 to X).

As an alternative or in addition, heat-conducting materials such as films or foils, coatings or encapsulation or adhesive compounds can be used.

The described exemplary embodiments are chosen only by way of example and can be combined with one another. Components other than an electrical component can also be cooled. In addition, heating can be performed instead of cooling. In this case, heat can be given off by the fluid which is located in the fluid-conducting chamber, by means of the heat-transfer region of the cover.

Figure 3:
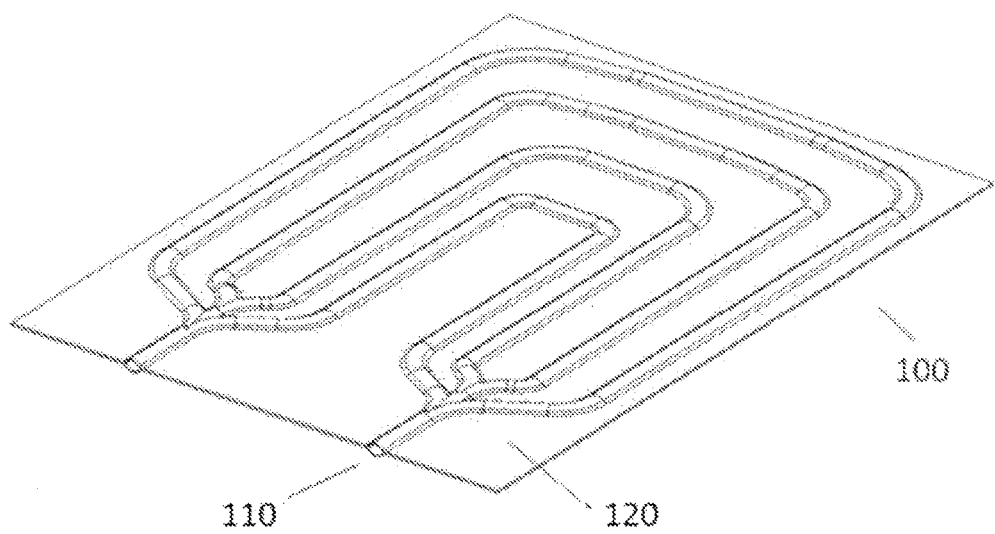
FIG. 3 shows a perspective illustration of a device for conducting a cooling fluid, according to a further exemplary embodiment of the present invention.

FIG. 3 shows a perspective exploded illustration of a further exemplary embodiment of a device 100 for conducting a cooling fluid. Said figure shows a fluid-conducting chamber 110 and a cover 120. The essential difference from the exemplary embodiment according to FIG. 1 is that both the fluid-conducting chamber 110 and the cover 120 are formed from a flexible material. According to this exemplary embodiment, the device comprises at least a cover 120, in this embodiment a film or foil which is in the form of a cover, and a fluid conducting chamber 110, in this embodiment a film or foil which is in the form of a fluid-conducting chamber, said films or foils being partially welded to one another.

Figure 4:
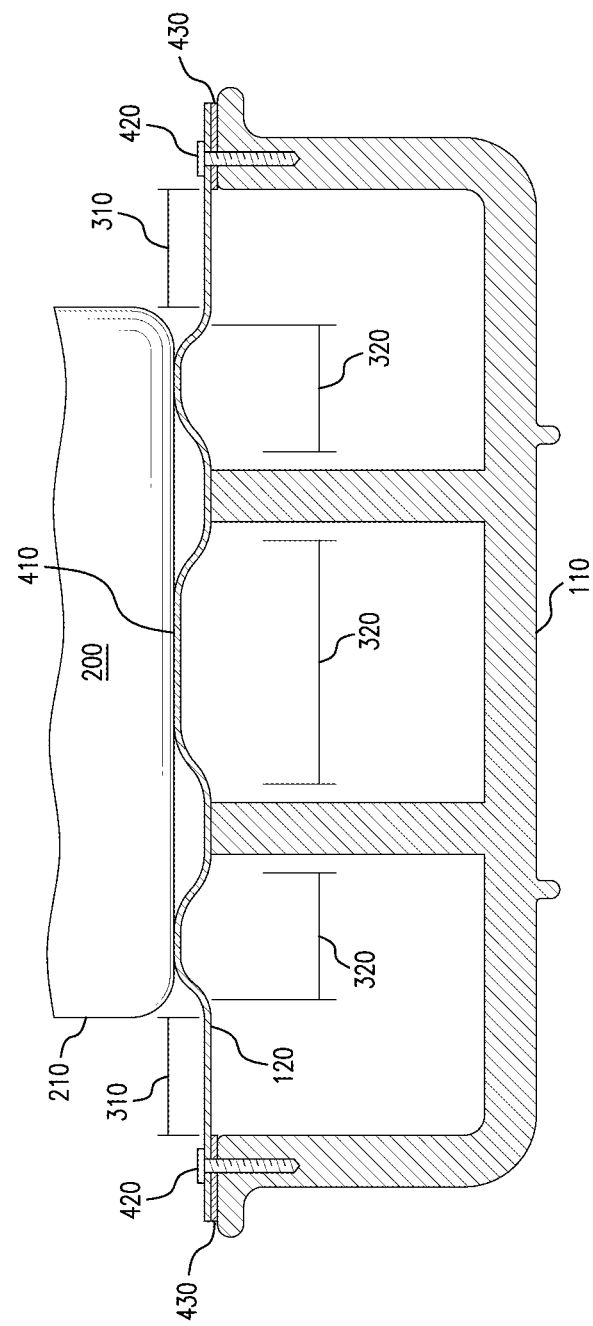
FIG. 4 shows a sectional illustration through a cooling system for cooling an electrical component, according to one exemplary embodiment of the present invention.

FIG. 4 shows a sectional illustration through a detail of a cooling system 200 for cooling an electrical component, according to one exemplary embodiment of the present invention. Said figure shows an embodiment of the device 100 from FIG. 1 in the assembled state and a base region of an electrical component 210. The illustration in FIG. 4 shows that the cover 120 of the device 100 is rigid in rigid region 310 and flexible in region 320, wherein the region 320 corresponds to a geometry of the electrical component. FIG. 4 also shows that cover 120 has an adhesive coating 410 and that the fluid-conducting chamber is connected to the cover in an interlocking manner and/or in a force-fitting manner and/or in a materially cohesive manner (420, 430).

The invention claimed is:

1. A device for conducting a cooling fluid for cooling an electrical component, wherein the device has the following features:
   a fluid-conducting chamber for conducting the cooling fluid;
   side walls; and
   an at least partially flexible cover, wherein the cover closes off the fluid-conducting chamber in a fluid-tight manner, wherein the cover comprises an edge region corresponding to the side walls, a heat-transfer region for conducting heat between the cooling fluid and the electrical component corresponding to a geometry of the electrical component, and a boundary region between the edge region and the heat-transfer region that is not covered by the electrical component, wherein the cover is inflexible in the boundary region, and is flexible in the heat-transfer region, wherein flexibility allows fluid pressure to cause deformation of the cover.

2. The device as claimed in claim 1, in which the cover is a film or foil.

3. The device as claimed in claim 1, in which the cover is formed from an electrically insulating material.

4. The device as claimed in claim 1, in which a side of the cover which faces the electrical component is structured to increase the surface area of the heat-transfer region in comparison to a smooth cover.

5. The device as claimed in claim 1, in which a side of the cover which faces the electrical component has an adhesive coating.

6. The device as claimed in claim 1, in which the fluid-conducting chamber is connected to the cover in an interlocking manner and/or in a force-fitting manner and/or in a materially cohesive manner.

7. The device as claimed in claim 1, in which the fluid-conducting chamber has an interior space having at least one partition wall for conducting the cooling fluid.

8. The device as claimed in claim 1, in which the fluid-conducting chamber is also at least partially flexible.

9. A cooling system for cooling an electrical component, which cooling system has the following features:
the electrical component; and
a device as claimed in claim 1, wherein the electrical component is arranged in the heat-transfer region of the cover of the device.

10. The device as claimed in claim 1, wherein the heat-transfer region is a central region of the cover.

11. The device as claimed in claim 1, wherein the edge region is inflexible.

12. A device for conducting a cooling fluid for cooling an electrical component, wherein the device has the following features:
a fluid-conducting chamber for conducting the cooling fluid;
side walls; and
an at least partially flexible cover, wherein the cover closes off the fluid-conducting chamber in a fluid-tight manner, wherein the cover comprises an edge region corresponding to the side walls, a heat-transfer region for conducting heat between the cooling fluid and the electrical component corresponding to a geometry of the electrical component, and a boundary region between the edge region and the heat-transfer region that is not covered by the electrical component, wherein the cover is inflexible in the boundary region and edge region, and is flexible in the heat-transfer region, wherein flexibility allows fluid pressure to cause deformation of the cover, wherein the heat-transfer region is a central region of the cover,
wherein the cover is a film or foil, wherein the cover is formed from an electrically insulating material, wherein a side of the cover which faces the electrical component is structured to increase the surface area of the heat-transfer region in comparison to a smooth cover, wherein a side of the cover which faces the electrical component has an adhesive coating.

* * * * *